US005751757A

United States Patent [19]
Jiang et al.

[11] Patent Number: 5,751,757
[45] Date of Patent: May 12, 1998

[54] VCSEL WITH INTEGRATED MSM PHOTODETECTOR

[75] Inventors: Wenbin Jiang, Phoenix; Chan-Long Shieh, Paradise Valley; Michael S. Lebby, Apache Junction, all of Ariz.

[73] Assignee: Motorola, Inc., Schaumburg, Ill.

[21] Appl. No.: 675,307

[22] Filed: Jul. 1, 1996

[51] Int. Cl.$^6$ ........................................ H01S 3/19
[52] U.S. Cl. ........................... 372/50; 372/96; 372/46
[58] Field of Search ............................. 372/96, 50, 46, 372/45

[56] References Cited

U.S. PATENT DOCUMENTS 5,491,712  2/1996  Lin et al. ............................ 372/50
5,606,572  2/1997  Swirhun et al. ...................... 372/96

Primary Examiner—James W. Davie
Attorney, Agent, or Firm—Eugene A. Parsons

[57] ABSTRACT

A VCSEL (113) having a first and a second stack of distributed Bragg reflectors (120, 116) and an active region (118) defining a light generating and emitting path. A layer (104) of semiconductor material is formed on the second stack (116) so as to intersect the light path and a first electrode (106) and a second electrode (108) are disposed on the layer (104) to form a metal-semiconductor-metal photodetector (102). The metal-semiconductor-metal photodetector (102) absorbs some of the light emitted by the VCSEL (113) and provides an indication of the light output intensity, which indication may be used to control the VCSEL (113).

14 Claims, 1 Drawing Sheet

VCSEL WITH INTEGRATED MSM PHOTODETECTOR

FIELD OF THE INVENTION

This invention relates, in general, to optical devices and, more particularly, to light emitting devices and photodetectors.

BACKGROUND OF THE INVENTION

Automatic power control (APC) of light emitting devices allows for a constant and a consistent output from these devices. Generally, automatic power control of edge emitting laser devices is easily achieved because edge emitting devices emit light from two ends. Thus, enabling one of the light emitting ends to be used to measure the power output, which measurement is subsequently used to adjust the power input to the edge emitting device, thereby adjusting the power output.

However, automatic power control of a vertical cavity surface emitting laser (VCSEL) is a difficult task because the VCSEL generally emits light from only a single surface, thus making measurement of the output and subsequent adjustment thereof a difficult task. Conventionally, in order to accomplish this task, several optical devices, such as photodiodes, mirrors, beam splitters, and the like are positioned manually in the optical path of the emission from the VCSEL. With the optical devices being positioned manually, several problems or disadvantages result, such as a high cost of manufacture, a lack of repeatability, and poor quality control, thus prohibiting high volume manufacturing.

It can be readily seen that conventional APC of VCSELs has several disadvantages and problems, thus not enabling their manufacture in volume manufacturing applications. Therefore, an integrated article and method for making same that simplifies the fabrication process, reduces cost, and improves reliability would be highly desirable.

SUMMARY OF THE INVENTION

The above problems and others are at least partially solved and the above purposes and others are realized in an integrated vertical cavity surface emitting laser and integrated metal-semiconductor-metal photodetector. The vertical cavity surface emitting laser includes a substrate with a first surface, a first stack of distributed Bragg reflectors disposed on the first surface of the substrate, an active area disposed on the first stack of distributed Bragg reflectors, a second stack of distributed Bragg reflectors disposed on the active area so as to define an optical pathway through which light is generated and passes, and first and second electrical contacts coupled to the first and second stacks respectively for supplying operating power thereto. The integrated metal-semiconductor-metal photodetector includes a layer of semiconductor material disposed on the second stack of distributed Bragg reflectors so as to intersect the optical pathway and first and second spaced apart electrodes disposed on the layer of semiconductor material so as to define the metal-semiconductor-metal photodetector in cooperation with the insulative layer.

BRIEF DESCRIPTION OF THE DRAWINGS

Referring to the drawings.

DESCRIPTION OF THE PREFERRED EMBODIMENT

Figure 1:
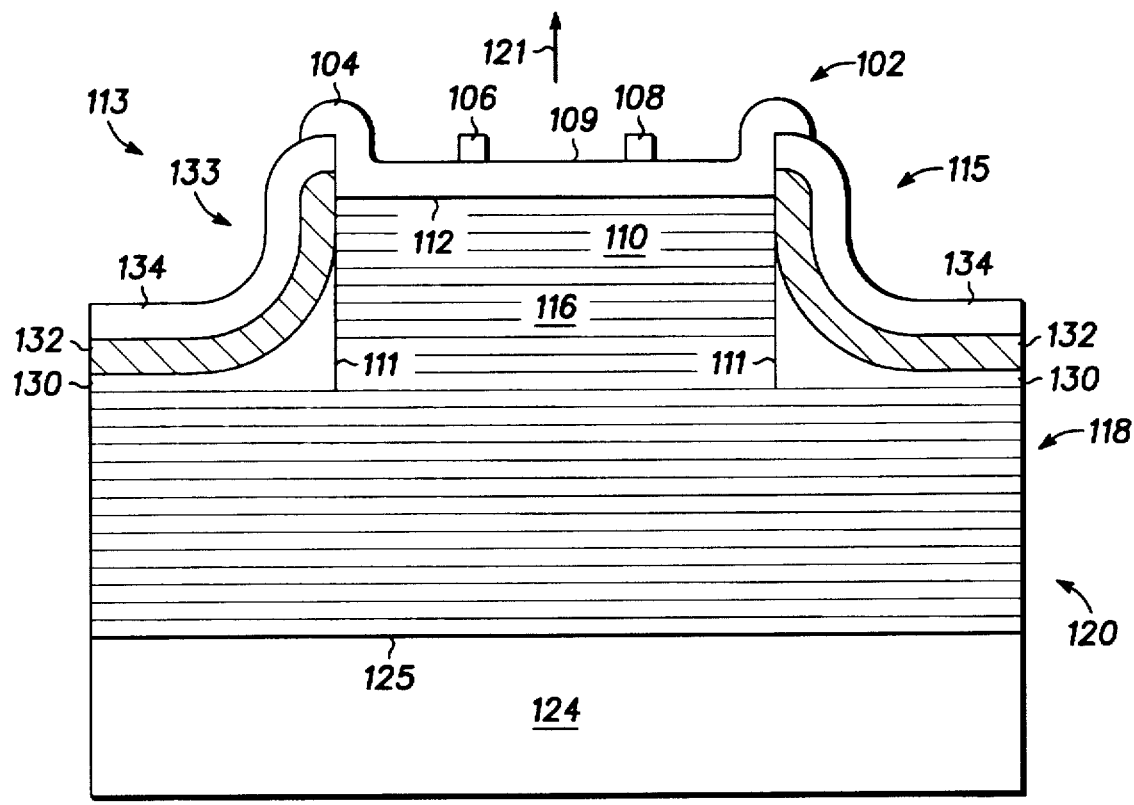
FIG. 1 is a simplified sectional view of a ridge VCSEL with a MSM photodetector in accordance with the present invention.
Figure 2:
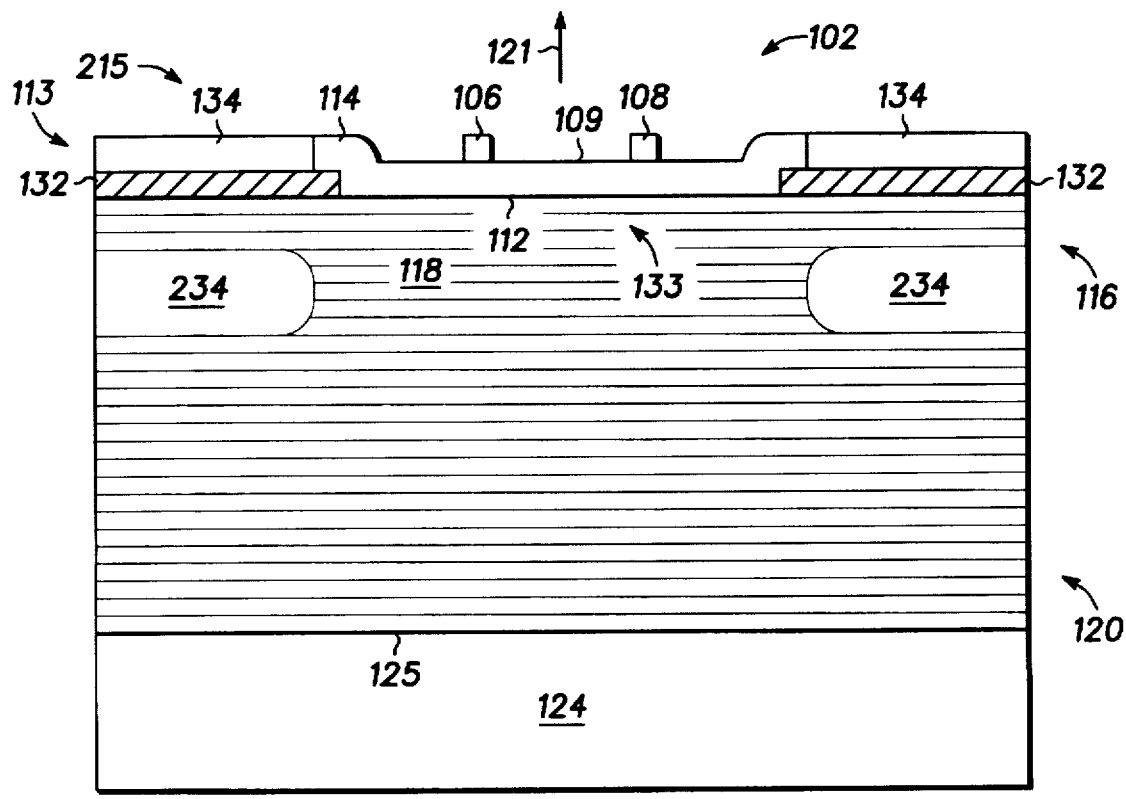
FIG. 2 is a simplified sectional view of a planar VCSEL with a MSM photodetector in accordance with the present invention.

FIGS. 1 and 2 illustrate an integrated device 100 that includes a metal-semiconductor-metal (MSM) photodetector 102 for measuring light 121 emitted from a vertical cavity surface emitting laser (VCSEL). However, it should be noted that in FIG. 1 the VCSEL is represented by a ridge VCSEL 115 and in FIG. 2 the VCSEL is represented by a planar VCSEL 215. M-S-M photodetector 102 includes a thin layer 104 of semiconductor material having an upper surface 109 with an electrode 106 and an electrode 108 formed thereon. As shown in FIG.s 1 and 2, both ridge VCSEL 115 and planar VCSEL 215 include the following components, which are similarly numbered for convenience in comparing and understanding. The components are: a substrate 124 having a surface 125, a first stack 120 of distributed Bragg reflectors, an active region 118, a second stack 116 of distributed Bragg reflectors, a conductive layer 132, and an insulative layer 134. As illustrated in FIG. 1, ridge VCSEL 115 is shown to also include an insulative layer 130 and a ridge or mesa 110, defined by sidewalls 111 and a surface 112, to confine the operating current. Whereas planar VCSEL 215 illustrated in FIG. 2 includes a damaged region or area 234, rather than a ridge or mesa, to confine the operating current.

It should be understood that FIG.s 1 and 2 are simplified illustrations and that many elements have been purposefully omitted or simplified to more clearly illustrate the present invention. Further, it should be noted that FIG.s 1 and 2 are sectional views and that integrated device 100 extends into an out of the figures as well as to either or both sides. Thus, integrated device 100 can be used to illustrate a single or an array of integrated devices.

Generally, as shown in FIG.s 1 and 2, both ridge VCSEL 115 and planar VCSEL 215 are made by any well-known method in the art. However, for the purposes of orienting the reader, a brief description of materials and methods is provided hereinbelow. Briefly, both ridge VCSEL 115 and planar VCSEL 215 are fabricated on any suitable semiconductor substrate, such as gallium arsenide, indium phosphite, or the like where the semiconductor substrate defines a surface 125. First stack 120 of distributed Bragg reflectors, active area 118, and second stack 116 of distributed Bragg reflectors are epitaxially deposited on surface 125 by any suitable method, such as molecular beam epitaxy (MBE), meto-organic chemical vapor deposition (MOCVD), or the like.

Referring specifically to FIG. 1, in the present invention and with the epitaxial depositions completed, second stack 116 of distributed Bragg reflectors is patterned to form ridge 110. Generally, ridge 110 is made by any suitable well-known method in the art, such as photolithography, etching, lift-off, any combination thereof, or the like. By defining ridge 110 in second stack 116 of distributed Bragg reflectors, an optical path is defined in second stack 116 that reflects and guides light formed in active region or area 118.

Referring now to FIG. 2, once the epitaxial depositions are complete, an ion implant mask (not shown) is formed on second stack 116 of distributed Bragg reflectors. The ion implant mask is fabricated by any suitable well-known method in the art such as photolithography, deposition, etching, combination thereof, or the like. The ion implant mask provides openings which expose portions of second stack 116 while covering or protecting other portions of second stack 116. Typically, the ion implant mask is shaped in a dot pattern, i.e., islands of the ion implant mask are placed on second stack 116. Once the ion implant mask is formed, second stack 116 is ion implanted by any suitable well-known method in the art. Generally, ion implantation injects ions through the exposed surface of second stack 116, while the ion implant mask protects and does not allow the ions to penetrate into the unexposed surface. When the ions pass through the surface and come to rest in second stack 116, they cause damage in the crystal lattice structure which results in high resistance damaged areas 234. Because damaged areas 234 do not conduct current as readily as where there is no damage, current is confined to areas where there is no damage.

Once ridge VCSEL 115 or planar VCSEL 215 have been formed, a series of depositions and patterning steps are performed to fabricate insulative layer 130, conductive layer 132, layer 104 of semiconductor material, an insulative layer 134, and electrodes 106 and 108. Generally, the depositions are performed by any suitable well-known methods in the art such as chemical vapor deposition (CVD), plasma enhanced chemical vapor deposition (PECVD), sputtering, or the like. In addition, the pattering steps also are performed by any suitable well-know methods in the art, such as photolithography, lift-off, etching, or combination thereof, or the like.

Referring to FIG. 1, insulative layer 130 is made of any suitable dielectric material, such as nitride, oxynitride, oxide, or the like. Insulative layer 130 is deposited on substrate 124, so as to overlie structures previously described. Typically, insulative layer 130 is deposited as a conformal layer, thereby insulative layer 130 conforms to ridge 110. Insulative layer 130 is then patterned to expose surface 112 of ridge 110 while the remaining portions of insulative layer 130 passivate or insulate structures where insulative layer 130 remains as shown in FIG. 1.

Referring to both FIG.s 1 and 2, conductive layer 132 is then deposited on substrate 124. Conductive layer 132 is made of any suitable electrically conductive material or alloys, such as titanium tungsten, titanium gold, gold, aluminum, silver, or the like. Conductive layer 132 is then subsequently patterned to define an opening therethrough exposing surface 112 of second stack 116 of distributed Bragg reflectors, thus conductive layer 132 provides both an opening which exposes surface 112, as well as making an electrical contact which electrically couples conductive layer 132 to second stack 116 of distributed Bragg reflectors. Further, it should be understood that contact to first stack 120 of distributed Bragg reflectors is generally achieved through substrate 124 (either side).

MSM photodetector 102 includes layer 104 of semiconductor material and electrodes 106 and 108. MSM photodetector 102 captures and measures a small percentage (approximately 10 percent) of light, represented by an arrow 121, being emitted from VCSEL 113, thereby allowing power output, i.e. light output of VCSEL 113, to be measured and subsequently adjusted to a desired level.

Layer 104 of semiconductor material is made of any suitable material, generally having a silicon component, such as silicon, hydrogenated silicon, or hydrogenated amorphous silicon (a-Si:H), or the like. However, in a preferred embodiment of the present invention, layer 104 is made by depositing a layer of hydrogenated amorphous silicon on exposed surface 112 in the opening in conductive layer 132. Generally, since the layer of hydrogenated amorphous silicon is deposited by PECVD, the layer is continuous across the structure. Also, the PECVD process can be varied so as to change the deposition characteristics. For example, PECVD pressures can range from 50 millitorr to 1.0 atmosphere, with a preferred range from 300 millitorr to 700 millitorr, and a nominal value on the order of 500 millitorr. Radio frequency (RF) power levels can be measured by Watts (W)/centimeter $cm^2$. In the present invention, RF power ranges from 10 $mW/cm^2$ to 60 $mW/cm^2$, with a preferred range from 15 $mW/cm^2$ to 35 $mW/cm^2$, and a nominal value of 20 $mw/cm^2$. However, it should be understood that depending upon the size of a reaction chamber and an amount of gas flowing into the chamber RF power levels and pressures can change.

The thickness of layer 104 generally is as thin as possible, while allowing normal operation of photodetector 102, thereby allowing a majority of light 121 to pass through MSM photodetector 102. By way of example, assuming a ten (10) percent absorption of light 121 and a coefficient of absorption of 1000 $cm^{-1}$, the total thickness will be in a range from approximately 0.7 micron to 1.2 microns (700 to 12,000 Angstroms), with a preferred thickness ranging from 0.8 micron to 1.0 micron (800 to 10,000 Angstroms) and a nominal thickness of 0.9 micron (900 Angstroms). However, it should be understood that the thickness of the layer is dependent on the wavelength of light (arrow 121). While the above thickness and ranges are useful for light having a wavelength from 650 nanometer (nm) to 730 nm, light having a wavelength from 780 nm to 850 nm may require a suitable material that enhances absorption at these wavelengths. By way of example, absorption can be increased at these wavelengths by using an amorphous silicon germanium alloy, or the like.

Once layer 104 of amorphous silicon has been deposited, the layer is patterned and etched by any suitable method well known in the art to conform to the region defined by the opening in conductive layer 132. Typically, photolithography is used to define the pattern with the pattern being transferred by either a wet etch, i.e., Nitric acid ($HNO_3$) plus Hydrofluoric acid (HF) solution or a dry etch, i.e., a gas plasma containing fluorine ($CHF_3$). It should be understood that when selecting an etch method care should be used so as to provide the highest selectivity as reasonably possible.

With layer 104 deposited and patterned, electrodes 106 and 108 are formed on surface 109 of layer 104. Electrodes 106 and 108 are made of any suitable conductive material, such as gold, platinum, or the like. However, since indium tin oxide (ITO) is both optically clear and electrically conductive, indium tin oxide is preferred in the present embodiment, thus allowing as much light to pass through MSM photodetector 102 as possible. Generally, the conductive material used for electrodes 106 and 108 is deposited by any suitable method well known in the art, such as evaporation, sputtering, or the like. However, in using indium tin oxide, a preferred method of deposition is sputtering, thereby providing a uniform film or layer. Once the conductive material has been deposited, the conductive material is patterned to define electrodes 106 and 108 as shown in FIG.s 1 and 2. Typically, this is achieved by any suitable method well known in the art, such as photolithography, etching, lift-off, any combination thereof, or the like.

While only two electrodes 106 and 108 are shown, it should be understood that other electrodes can be add to form an array or a plurality of electrodes. Typically, when more than two electrodes are used, an interdigitated array is formed. Electrodes 106 and 108 can be electrically charged or electrically active to detect photons passing through layer 104. For example, electrode 106 can be charged negatively while electrode 108 can be charged positively. Alternatively, electrode 106 can be grounded.

In a specific embodiment, layer 104 of semiconductor material is a layer of undoped amorphous silicon with the bandgap $E_g$ (wavelength $\lambda_g$) deposited on exposed surface 112 with a thickness of around 1 µm. Electrodes 106 and 108 are interdigitated Schottky contact fingers formed of metals or transparent indium-tin-oxide (ITO) and are deposited on top of the amorphous silicon to form a metal-semiconductor-metal (MSM) photo detector vertically integrated with VCSEL 113. The finger width is 1–3 µm. and the spacing between the fingers is 3–5 µm. depending on the speed and the efficiency requirement for the detector. A voltage bias is applied to the fingers to establish an electrical field in the detector. When light with a wavelength of $\lambda<\lambda g$ is emitted from the VCSEL. it transmits through the amorphous silicon (layer 104) and the transparent ITO fingers (electrodes 106 and 108) with a portion of the light being absorbed by the amorphous silicon. The thickness of the silicon absorption region is so designed that about 10% of the incident light is absorbed and 90% of the incident light is transmitted from VCSEL 113. The photons absorbed in the amorphous silicon region create electron-hole pairs, and the pairs are separated by the electrical field with electrons drifting toward positive biased fingers and holes drifting toward negative biased fingers. If there is a closed loop between the fingers, electrical current is detectable with the magnitude being proportional to the incident laser intensity. The magnitude of the current can be used to send a feedback signal to VCSEL 113 to control injection circuitry for auto power control (APC).

By now it should be appreciated that a novel integrated VCSEL and photodetector and method for fabricating the novel structure have been provided. The VCSEL is integrated with a MSM photodetector, thereby enabling the light output of the VCSEL to be easily monitored and subsequently adjusted to a desired level. Additional, since the VCSEL and photodetector are fabricated as one device, the VCSEL integrated with the MSM detector is highly manufacturable, thus reducing cost and allowing significant improvements in reliability and quality.

While we have shown and described specific embodiments of the present invention, further modification and improvement will occur to those skilled in the art. We desire it to be understood, therefore, that this invention is not limited to the particular forms shown and we intend in the appended claims to cover all modification that do not depart from the spirit and scope of this invention.

What is claimed is:

1. A vertical cavity surface emitting laser with an integrated metal-semiconductor-metal photodetector comprising:

a vertical cavity surface emitting laser having a substrate with a first surface, a first stack of distributed Bragg reflectors disposed on the first surface of the substrate, an active area disposed on the first stack of distributed Bragg reflectors, a second stack of distributed Bragg reflectors disposed on the active area so as to define an optical pathway through which light is generated and passes, the vertical cavity surface emitting laser further including first and second electrical contacts coupled to the first and second stacks respectively for supplying operating power thereto;

a layer of semiconductor material disposed on the second stack of distributed Bragg reflectors so as to intersect the optical pathway; and first and second spaced apart electrodes disposed on the layer of semiconductor material so as to define a metal-semiconductor-metal photodetector in cooperation with the layer of semiconductor material.

2. A vertical cavity surface emitting laser with an integrated metal-semiconductor-metal photodetector as claimed in claim 1 wherein the first electrode is grounded.

3. A vertical cavity surface emitting laser with an integrated metal-semiconductor-metal photodetector as claimed in claim 2 wherein the second electrode is electrically active.

4. A vertical cavity surface emitting laser with an integrated metal-semiconductor-metal photodetector as claimed in claim 1 wherein the first electrode is positively charged.

5. A vertical cavity surface emitting laser with an integrated metal-semiconductor-metal photodetector as claimed in claim 4 wherein the second electrode is negatively charged.

6. A vertical cavity surface emitting laser with an integrated metal-semiconductor-metal photodetector as claimed in claim 1 wherein the first electrode and the second electrode are part of a plurality of electrodes.

7. A vertical cavity surface emitting laser with an integrated metal-semiconductor-metal photodetector as claimed in claim 1 wherein the first electrode is made of indium tin oxide.

8. A vertical cavity surface emitting laser with an integrated metal-semiconductor-metal photodetector as claimed in claim 1 wherein the layer of semiconductor material is made with a silicon component.

9. A vertical cavity surface emitting laser with an integrated metal-semiconductor-metal photodetector as claimed in claim 8 wherein the silicon component is amorphous silicon.

10. A vertical cavity surface emitting laser with an integrated metal-semiconductor-metal photodetector as claimed in claim 1 wherein the thickness of the layer of semiconductor material ranges from 700 Angstroms to 12,000 Angstroms.

11. A vertical cavity surface emitting laser with an integrated metal-semiconductor-metal photodetector as claimed in claim 10 wherein the thickness of the layer of semiconductor material ranges from 800 Angstroms to 10,000 Angstroms.

12. A vertical cavity surface emitting laser with an integrated metal-semiconductor-metal photodetector comprising:

a vertical cavity surface emitting laser having a substrate with a first surface, a first stack of distributed Bragg reflectors disposed on the first surface of the substrate, an active area disposed on the first stack of distributed Bragg reflectors, a second stack of distributed Bragg reflectors disposed on the active area so as to define an optical pathway through which light is generated and passes, the vertical cavity surface emitting laser further including first and second electrical contacts coupled to the first and second stacks respectively for supplying operating power thereto;

a layer of amorphous silicon disposed on the second stack of distributed Bragg reflectors so as to intersect the optical pathway; and first and second spaced apart electrodes of indium-tin-oxide disposed on the layer of amorphous silicon so as to define a metal-semiconductor-metal photodetector in cooperation with the layer of amorphous silicon.

13. A vertical cavity surface emitting laser with an integrated metal-semiconductor-metal photodetector as claimed in claim 12 wherein the thickness of the layer of amorphous silicon ranges from 700 Angstroms to 12,000 Angstroms.

14. A vertical cavity surface emitting laser with an integrated metal-semiconductor-metal photodetector as claimed in claim 12 wherein the first electrode and the second electrode are formed as a plurality of interdigitated fingers.

* * * * *